(12) United States Patent
Mizoguchi et al.

(10) Patent No.: US 7,834,798 B2
(45) Date of Patent: Nov. 16, 2010

(54) AD CONVERTER CIRCUIT AND OPTICAL SENSOR

(75) Inventors: Masaki Mizoguchi, Hamamatsu (JP); Yasuhiro Suzuki, Hamamatsu (JP); Seiichiro Mizuno, Hamamatsu (JP); Hiroo Yamamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 53 days.

(21) Appl. No.: 12/440,167

(22) PCT Filed: Sep. 5, 2007

(86) PCT No.: PCT/JP2007/067302
§ 371 (c)(1),
(2), (4) Date: Mar. 27, 2009

(87) PCT Pub. No.: WO2008/029841
PCT Pub. Date: Mar. 13, 2008

(65) Prior Publication Data
US 2010/0194621 A1    Aug. 5, 2010

(30) Foreign Application Priority Data
Sep. 6, 2006    (JP) .............................. 2006-241818

(51) Int. Cl.
*H03M 1/12* (2006.01)
(52) U.S. Cl. ....................... 341/172; 330/254
(58) Field of Classification Search .......... 341/155–172
See application file for complete search history.

(56) References Cited
U.S. PATENT DOCUMENTS

| | | | |
|---|---|---|---|
| 6,674,389 B2 * | 1/2004 | Bult .............................. | 341/159 |
| 7,075,470 B2 * | 7/2006 | Lee .............................. | 341/155 |
| 7,250,824 B2 * | 7/2007 | Geynet et al. .............. | 331/36 C |
| 7,274,319 B2 * | 9/2007 | Lee .............................. | 341/155 |
| 7,504,977 B2 * | 3/2009 | Doorenbos et al. .......... | 341/143 |

FOREIGN PATENT DOCUMENTS

| JP | 2001-53610 | 2/2001 |
|---|---|---|
| JP | 2002-43941 | 2/2002 |

OTHER PUBLICATIONS

Analog Devices, Inc., "Analog Devices—Technical Data Sheet of the Product AD7641," 2006, pp. 1-28, Norwood, MA (USA).

* cited by examiner

*Primary Examiner*—Lam T Mai
(74) *Attorney, Agent, or Firm*—Drinker Biddle & Reath LLP

(57) ABSTRACT

The A/D converting circuit 20 is provided with a differential amplifying portion 21, a first variable capacitance portion 22A, a second variable capacitance portion 22B, a comparing portion 23, a connection controlling portion 24, a first feedback portion 25A and a second feedback portion 25B. Voltage values output as a differential signal from the first output terminal and the second output terminal of the differential amplifying portion 21 are converted to 6-bit digital values by a successive approximation type A/D converting circuit (made up of a first variable capacitance portion 22A, a second variable capacitance portion 22B, a comparing portion 23 and a connection controlling portion 24) and output. A difference in potential between the first common point $P_1$ and the second common point $P_2$ is fed back to the differential amplifying portion 21 by the first feedback portion 25A and the second feedback portion 25B, and again converted to a 6-bit digital value by the successive approximation type A/D converting circuit and output.

3 Claims, 5 Drawing Sheets

Fig.4
(a)
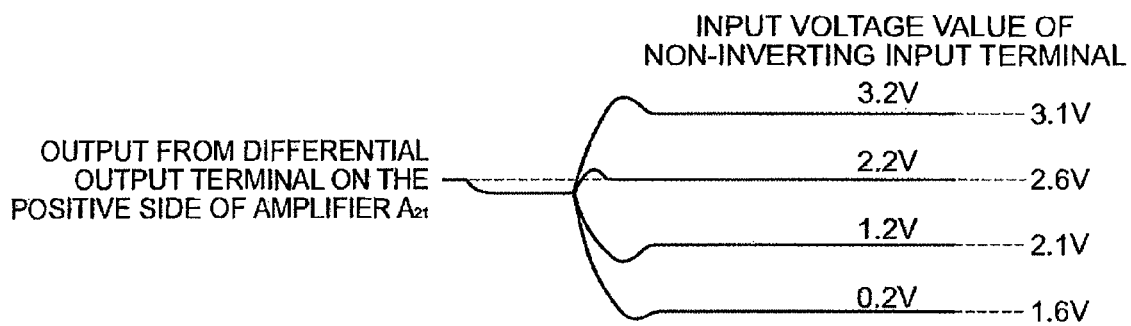
(b)
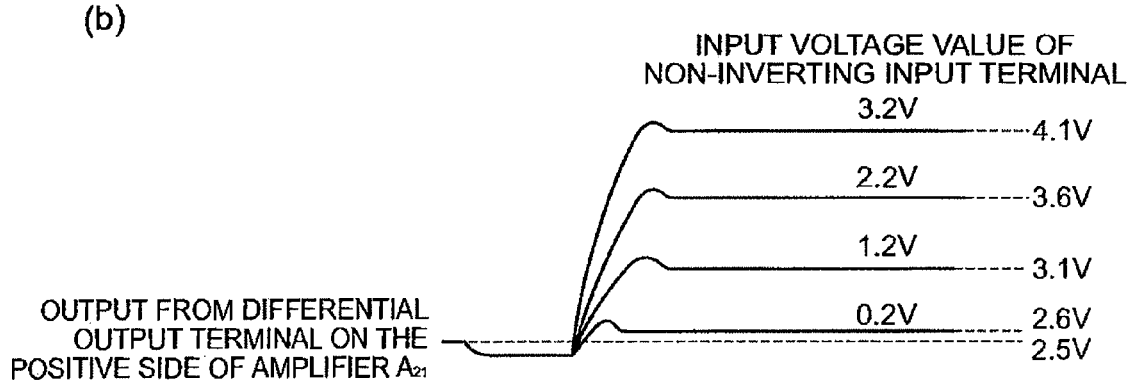

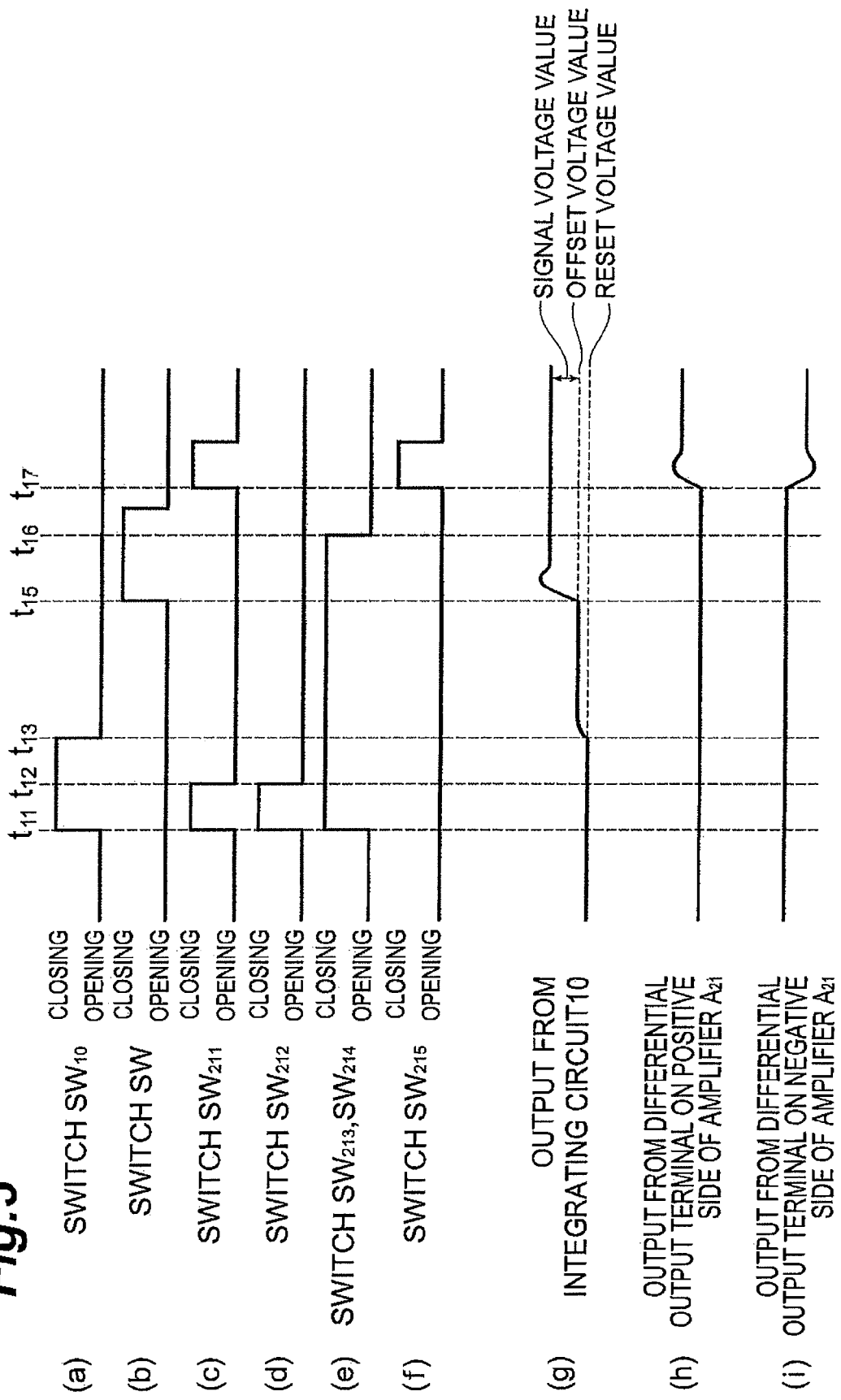

AD CONVERTER CIRCUIT AND OPTICAL SENSOR

TECHNICAL FIELD

The present invention relates to a photo detecting apparatus capable of outputting a digital value corresponding to an amount of incident light and an A/D (analog-to-digital) converting circuit preferably used in the photodetecting apparatus of this type.

BACKGROUND ART

A photodetecting apparatus is provided with a photodiode for generating an amount of electrical charge corresponding to an amount of incident light and an integrating circuit for accumulating the electrical charge generated by the photodiode to output a voltage value corresponding to an amount of the thus accumulated electrical charge. Further, the photodetecting apparatus may be provided from time to time with an A/D converting circuit for converting a voltage value (analog value) output from the integrating circuit to a digital value, thereby outputting the digital value. Still further, where a plurality of photodiodes are arrayed one-dimensionally or two-dimensionally, the photodetecting apparatus is able to pick up a one-dimensional image or a two-dimensional image.

There has been known an A/D converting circuit having the constitution disclosed in Non-Patent Document 1 as an A/D converting circuit used in the above-described photodetecting apparatus. This A/D converting circuit, which includes at least 2 N-number of capacitors, is able to input an analog value to be subjected to A/D conversion as a differential signal and output an N-bit digital value corresponding to the analog value. In this instance, N is an integer number equal to or greater than two.

In a photodetecting apparatus including the above-described A/D converting circuit, when an amount of electrical charge corresponding to an amount of incident light to photodiodes is accumulated, a voltage value (signal component+noise component) output from an integrating circuit is input into the A/D converting circuit, and when the electrical charge is not accumulated, a voltage value (noise component) output from the integrating circuit is input into the A/D converting circuit. Thereby, a difference between these two voltage values (that is, only the signal component) is converted by the A/D converting circuit to a digital value. Therefore, the digital value output from the A/D converting circuit is a value corresponding to an amount of incident light to photodiodes, that is, a highly accurate value from which the noise component is eliminated.

Non-Patent Document 1: Technical Data Sheet of the product AD7641 available from Analog Devices Inc.

DISCLOSURE OF THE INVENTION

Problem to be Solved by the Invention

However, the above-described A/D converting circuit is required to include at least as many as 2 N-number of capacitors corresponding to a bit number N for outputting digital values and also required to include capacitors extremely great in capacitance value. Due to the above reason the A/D converting circuit and the photodetecting apparatus are large in size and result in a great chip area when they are integrated.

The present invention has been made in order to solve the above problem, an object of which is to provide an A/D converting circuit and a photodetecting apparatus which can be downsized.

Means for Solving the Problem

The A/D converting circuit of the present invention is provided with (1) a differential amplifying portion including an amplifier having a first and a second input terminal as well as a first and a second output terminal, a first to a fourth capacitor, and a first to a fourth switch in which one end of the first switch is connected to the first input terminal of the amplifier via the first capacitor, one end of the second switch is connected to the second input terminal of the amplifier via the second capacitor, the third switch and the third capacitor are installed in parallel between the first input terminal of the amplifier and the first output terminal thereof, and the fourth switch and the fourth capacitor are installed in parallel between the second input terminal of the amplifier and the second output terminal thereof, (2) a first variable capacitance portion including N-number of capacitors with mutually different capacitance values $(C, \ldots, 2^{n-1}C, \ldots 2^{N-1}C)$ in which one end of each of the N-number of capacitors is connected to the first output terminal of the amplifier, a first reference potential or a second reference potential via first connection switchover means, and the other end of each of the N-number of capacitors is connected to a first common point, (3) a second variable capacitance portion including N-number of capacitors with mutually different capacitance values $(C, 2^{n-1}C, \ldots, 2^{N-1}C)$ in which one end of each of the N-number of capacitors is connected to the second output terminal of the amplifier, the first reference potential or the second reference potential via second connection switchover means, and the other end of each of the N-number of capacitors is connected to a second common point, (4) a comparing portion for inputting the respective potentials of the first and the second common point for comparison of the magnitude and outputting a compared signal which indicates the compared result, (5) a connection controlling portion which inputs the compared signal output from the comparing portion, controls the connection and switchover respectively by the first and the second connection switchover means on the basis of the compared signal so as to decrease a difference between the respective potentials of the first and the second common point and outputs an N-bit digital value indicating the respective connection states by the first and the second connection switchover means, (6) a first feedback portion including a first feedback capacitor and a first feedback switch in which one end of the first feedback capacitor is connected to the first common point via the first feedback switch and the other end of the first feedback capacitor is connected to the first input terminal of the amplifier, and (7) a second feedback portion including a second feedback capacitor and a second feedback switch in which one end of the second feedback capacitor is connected to the second common point via the second feedback switch and the other end of the second feedback capacitor is connected to the second input terminal of the amplifier. In this instance, N is an integer number equal to or greater than two, and n is an integer number equal to or greater than one but equal to or less than N.

In the A/D converting circuit of the present invention, voltage values input into the first input terminal and the second input terminal of the differential amplifying portion is amplified by the differential amplifying portion and output as a differential signal from the first output terminal and the second output terminal of the differential amplifying portion.

The first variable capacitance portion, the second variable capacitance portion, the comparing portion and the connection controlling portion constitute a successive approximation type A/D converting circuit. The voltage values output from the first output terminal and the second output terminal of the differential amplifying portion are subjected to A/D conversion by the successive approximation type A/D converting circuit, and corresponding digital values are output from the connection controlling portion. The respective potentials of the first common point and the second common point input to the comparing portion are fed back to the differential amplifying portion by the first feedback portion and the second feedback portion, and again converted to digital values by the successive approximation type A/D converting circuit and output.

In the A/D converting circuit of the present invention, it is preferable that the differential amplifying portion additionally includes a fifth switch and an electric source and the electric source is connected to a connection point between the second switch and the second capacitor via the fifth switch. In this instance, the differential amplifying portion can be expanded in output range.

The photodetecting apparatus of the present invention is provided with a photodiode which generates an amount of electrical charge corresponding to an amount of incident light, an integrating circuit which inputs an electrical charge generated in the photodiode and accumulates it to output a voltage value corresponding to an amount of the thus accumulated electrical charge from an output end, and the above-described A/D converting circuit of the present invention, in which the first and the second switch of the differential amplifying portion included in the A/D converting circuit are connected to the output end of the integrating circuit. In the photodetecting apparatus, an amount of electrical charge corresponding to an amount of incident light is generated in a photodiode, the electrical charge thereof is input into the integrating circuit and accumulated, thereby a voltage value corresponding to an amount of the thus accumulated electrical charge is output from the output end of the integrating circuit. The voltage value output from the output end of the integrating circuit is input into the differential amplifying portion included in the A/D converting circuit. Then, the A/D converting circuit is used to eliminate an offset error and the like included in an output voltage value of the integrating circuit, thereby obtaining a digital value excellent in S/N (signal-to-noise) ratio.

Effect of the Invention

The present invention is able to provide an A/D converting circuit and a photodetecting apparatus which can be downsized.

BRIEF DESCRIPTION OF THE DRAWINGS

FIG. 4 is a timing chart for explaining operations of a differential amplifying portion 21 included in the A/D converting circuit 20 of the present embodiment.

FIG. 5 is a timing chart for explaining other operations of the photodetecting apparatus 1 of the present embodiment.

DESCRIPTION OF REFERENCE NUMERALS

Figure 1:
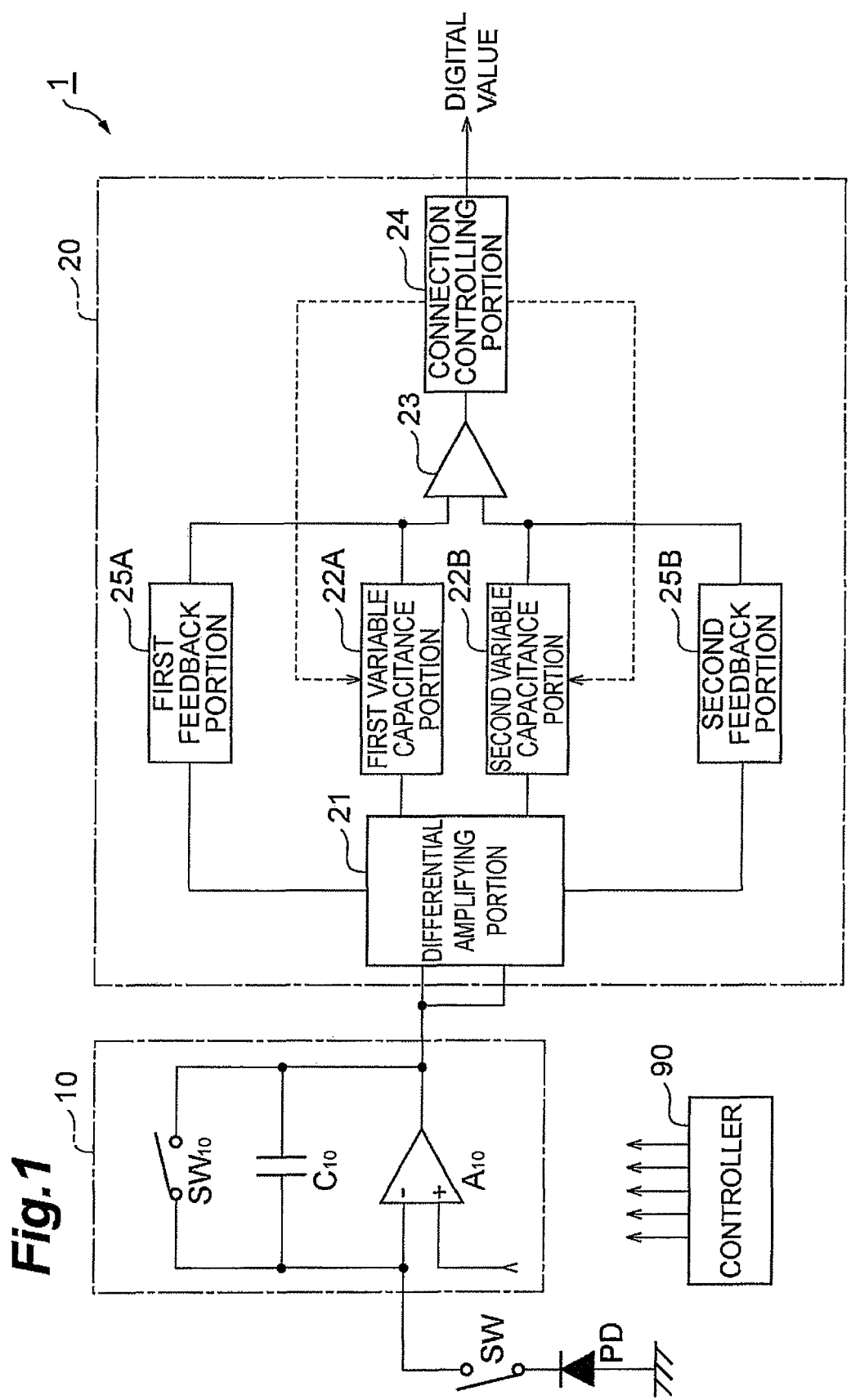
FIG. 1 is a drawing showing a constitution of a photodetecting apparatus 1 of the present embodiment.

1: Photodetecting apparatus
10: Integrating circuit
20: A/D converting circuit
21: Differential amplifying portion
22A: First variable capacitance portion
22B: Second variable capacitance portion
23: Comparing portion
24: Connection controlling portion
25A: First feedback portion
25B: Second feedback portion
90 Controller
A: Amplifier
C: Capacitor
PD: Photodiode
SW: Switch

BEST MODES FOR CARRYING OUT THE INVENTION

Hereinafter a detailed description will be given for the best mode for carrying out the present invention by referring to the attached drawings. In addition, in describing the drawings, the same elements will be given the same numerals, with redundant description omitted.

FIG. 1 is a drawing showing a constitution of the photodetecting apparatus 1 of the present embodiment As shown in this drawing, the photodetecting apparatus 1 is provided with a photodiode PD, a switch SW, an integrating circuit 10, an A/D converting circuit 20 and a controller 90. In addition, the photodiode PD and the switch SW may be arrayed as one set and a plurality of the sets may be arrayed one-dimensionally or two-dimensionally. In this instance, one set of the integrating circuit 10 and the A/D converting circuit 20 may be installed with respect to the plural sets of the photodiodes PD and the switches SW The photodiode PD is an element for generating an amount of electrical charge corresponding to an amount of incident light, with the anode grounded and the cathode connected to one end of the switch SW. The switch SW is installed between the photodiode PD and an input end of the integrating circuit 10, inputting an electrical charge generated in the photodiode PD into the integrating circuit 10, when closed. The integrating circuit 10 inputs an electrical charge which has been generated in the photodiode PD and reached via the switch SW, accumulates the electrical charge and outputs a voltage value corresponding to an amount of the thus accumulated electrical charge from the output end to the A/D converting circuit 20. The A/D converting circuit 20 inputs a voltage value (analog value) output from the integrating circuit 10, subjects the voltage value to A/D conversion, thereby outputting a digital value corresponding to the thus input voltage value.

The integrating circuit 10 is provided with an amplifier $A_{10}$, a capacitor $C_{10}$ and a switch $SW_{10}$. A reference voltage is input into a non-inverting input terminal of the amplifier $A_{10}$. The inverting input terminal of the amplifier $A_{10}$ is connected to the photodiode PD via the switch SW. The capacitor $C_{10}$ and the switch $SW_{10}$ are installed in parallel between the inverting input terminal and the output terminal of the amplifier $A_{10}$. When the switch $SW_{10}$ is closed, the capacitor $C_{10}$ is discharged to initialize a voltage value output from the integrating circuit 10. When the switch $SW_{10}$ is opened, an electrical charge input via the switch SW from the photodiode PD is accumulated in the capacitor $C_{10}$ and a voltage value corresponding to an amount of the thus accumulated electrical charge is output from the integrating circuit 10 to the A/D converting circuit 20.

The A/D converting circuit 20 is provided with a differential amplifying portion 21, a first variable capacitance portion 22A, a second variable capacitance portion 22B, a comparing portion 23, a connection controlling portion 24, a first feedback portion 25A and a second feedback portion 25B. The first variable capacitance portion 22A and the second variable capacitance portion 22B have a constitution which are mutually common. The first feedback portion 25A and the second feedback portion 25B have a constitution which are mutually common.

The controller 90 controls the opening and closing operation of the switch SW installed together with the photodiode PD, the opening and closing operation of the switch $SW_{10}$ included in the integrating circuit 10 and the A/D converting operation of the A/D converting circuit 20. In FIG. 1, a control signal output from the controller 90 and illustration of the wiring thereof.

Figure 2:
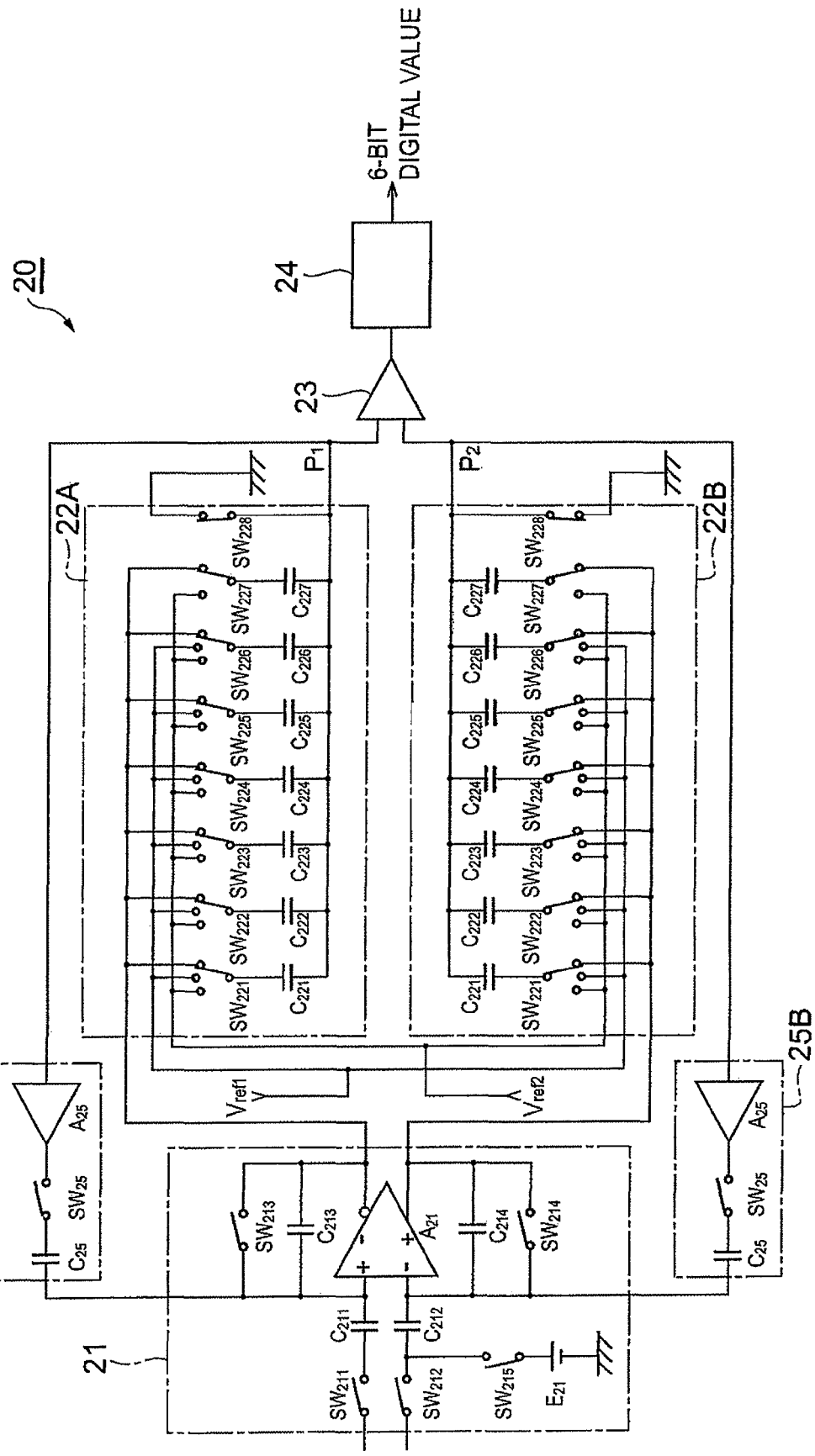
FIG. 2 is a circuit diagram of an A/D converting circuit 20 of the present embodiment.

Next, a description will be given for a circuit configuration of the A/D converting circuit 20 of the present embodiment. FIG. 2 is a circuit diagram showing the A/D converting circuit 20 of the present embodiment. In addition, in this instance, a description will be given on the assumption that an N value is 6.

The differential amplifying portion 21 is provided with an amplifier $A_{21}$, a first switch $SW_{211}$, a second switch $SW_{212}$, a third switch $SW_{213}$, a fourth switch $SW_{214}$, a fifth switch $SW_{215}$, a first capacitor $C_{211}$, a second capacitor $C_{212}$, a third capacitor $C_{213}$, a fourth capacitor $C_{214}$, and an electric source $E_{21}$. The amplifier $A_{21}$ amplifies a voltage value input into the non-inverting input terminal and the inverting input terminal as a differential signal at amplification factor of $2^6$ and outputs a voltage value after the amplification as a differential signal from a differential output terminal on the negative side and a differential output terminal from the positive side.

One end of the switch $SW_{211}$ is connected to a non-inverting input terminal of the amplifier $A_{21}$ via the capacitor $C_{211}$, while the other end of the switch $SW_{211}$ is connected to the output end of the integrating circuit 10. One end of the switch $SW_{212}$ is connected to an inverting input terminal of the amplifier $A_{21}$ via the capacitor $C_{212}$, while the other end of the switch $SW_{212}$ is connected to the output end of the integrating circuit 10. The switch $SW_{213}$ and the capacitor $C_{213}$ are installed in parallel between the non-inverting input terminal of the amplifier $A_{21}$ and the differential output terminal on the negative side thereof. The switch $SW_{214}$ and the capacitor $C_{214}$ are installed in parallel between the inverting input terminal of the amplifier $A_{21}$ and the differential output terminal on the positive side thereof. Further, the electric source $E_{21}$ is connected to a connection point between the switch $SW_{212}$ and the capacitor $C_{212}$ via the switch $SW_{215}$.

The first variable capacitance portion 22A is provided with capacitors $C_{221}$ to $C_{227}$ and switches $SW_{221}$ to $SW_{228}$. Of these components six capacitors $C_{221}$ to $C_{226}$ have a mutually different capacitance value, and six switches $SW_{221}$ to $SW_{226}$ constitute first connection switchover means. When a capacitance value of the capacitor $C_{226}$ is given as C, that of the capacitor $C_{221}$ is $2^5$C; that of the capacitor $C_{222}$ is $2^4$C, that of the capacitor $C_{223}$ is $2^3$C; that of the capacitor $C_{224}$ is $2^2$ C, and that of the capacitor $C_{225}$ is 2C. Further, a capacitance value of the capacitor $C_{227}$ is C.

One end of the capacitor $C_{221}$ is connected by the switch $SW_{221}$ to the differential output terminal on the negative side of the amplifier $A_{21}$, the first reference potential $V_{ref1}$ or the second reference potential $V_{ref2}$. One end of the capacitor $C_{222}$ is connected by the switch $SW_{222}$ to the differential output terminal on the negative side of the amplifier $A_{21}$ the first reference potential $V_{ref1}$ or the second reference potential $V_{ref2}$. One end of the capacitor $C_{223}$ is connected by the switch $SW_{223}$ to the differential output terminal on the negative side of the amplifier $A_{21}$, the first, reference potential $V_{ref1}$ or the second reference potential $V_{ref2}$. One end of the capacitor $C_{224}$ is connected by the switch $SW_{224}$ to the differential output terminal on the negative side of the amplifier $A_{21}$, the first reference potential $V_{ref1}$ or the second reference potential $V_{ref2}$. One end of the capacitor $C_{225}$ is connected by the switch $SW_{225}$ to the differential output terminal on the negative side of the amplifier $A_{21}$, the first reference potential $V_{ref1}$ or the second reference potential $V_{ref2}$. One end of the capacitor $C_{226}$ is connected by the switch $SW_{226}$ to the differential output terminal on the negative side of the amplifier $A_{21}$, the first reference potential $V_{ref1}$ or the second reference potential $V_{ref2}$. One end of the capacitor $C_{227}$ is connected by the switch $SW_{227}$ to the differential output terminal on the negative side of the amplifier $A_{21}$ or the second reference potential $V_{ref2}$. Further, the other end of each of the capacitors $C_{221}$ to $C_{227}$ is connected to the first common point $P_1$ and also connected to a ground potential via the switch $SW_{228}$.

The second variable capacitance portion 22B is similar in constitution to the first variable capacitance portion 22A. However, in the second variable capacitance portion 22B, six switches $SW_{221}$ to $SW_{226}$ constitute second connection switchover means. By the second connection switchover means, one end of each of the capacitors $C_{221}$ to $C_{226}$ is connected to the differential output terminal on the positive side of the amplifier $A_{21}$, the first reference potential $V_{ref1}$ or the second reference potential $V_{ref2}$. One end of the capacitor $C_{227}$ is connected by the switch $SW_{227}$ to the differential output terminal on the positive side of the amplifier $A_{21}$ or the second reference potential $V_{ref2}$. Further, the other end of each of the capacitors $C_{221}$ to $C_{227}$ is connected to the second common point $P_2$ and also connected to a ground potential via the switch $SW_{228}$.

The comparing portion 23 inputs the respective potentials of the first common point $P_1$ and the second common point $P_2$ to compare their magnitudes and outputs a compared signal indicating the compared result to the connection controlling portion 24. The connection controlling portion 24 inputs the compared signal output from the comparing portion 23, controls the connection and switchover respectively by the first and the second connection switchover means (switches $SW_{221}$ to $SW_{226}$ included at the variable capacitance portions 22A, 22B) on the basis of the compared signal so as to decrease a difference in potential between the first common point $P_1$ and the second common point $P_2$, and outputs a six-bit digital value indicating the respective connection states in the first and the second connection switchover means.

The first feedback portion 25A includes a buffer amplifier $A_{25}$, a capacitor $C_{25}$ and a switch $SW_{25}$. In the first feedback portion 25A, one end of the capacitor $C_{25}$ is connected to the output end of the buffer amplifier $A_{25}$ via the switch $SW_{25}$. The input end of the buffer amplifier $A_{25}$ is connected to the first common point $P_1$. The other end of the capacitor $C_{25}$ is connected to the non-inverting input terminal of the amplifier $A_{21}$.

The second feedback portion 25B also includes the buffer amplifier $A_{25}$, the capacitor $C_{25}$, and the switch $SW_{25}$. In the second feedback portion 25B, one end of the capacitor $C_{25}$ is connected to the output end of the buffer amplifier $A_{25}$ via the switch $SW_{25}$. The input end of the buffer amplifier $A_{25}$ is connected to the second common point $P_2$. The other end of the capacitor $C_{25}$ is connected to the inverting input terminal of the amplifier $A_{21}$.

The controller 90 controls the respective opening and closing operations of the switches $SW_{211}$ to $SW_{215}$ included at the differential amplifying portion 21, the respective operations of the comparing portion 23 and the connection controlling portion 24, and the opening and closing operation of the switch $SW_{25}$ included respectively at the first feedback portion 25A and the second feedback portion 25B. Then, the connection controlling portion 24 controlled by the controller 90 controls the respective opening and closing operations of the switches $SW_{221}$ to $SW_{228}$ included at the first variable capacitance portion 22A and the respective opening and closing operations of the switches $SW_{221}$ to $SW_{228}$ included at the second variable capacitance portion 22B.

Figure 3:
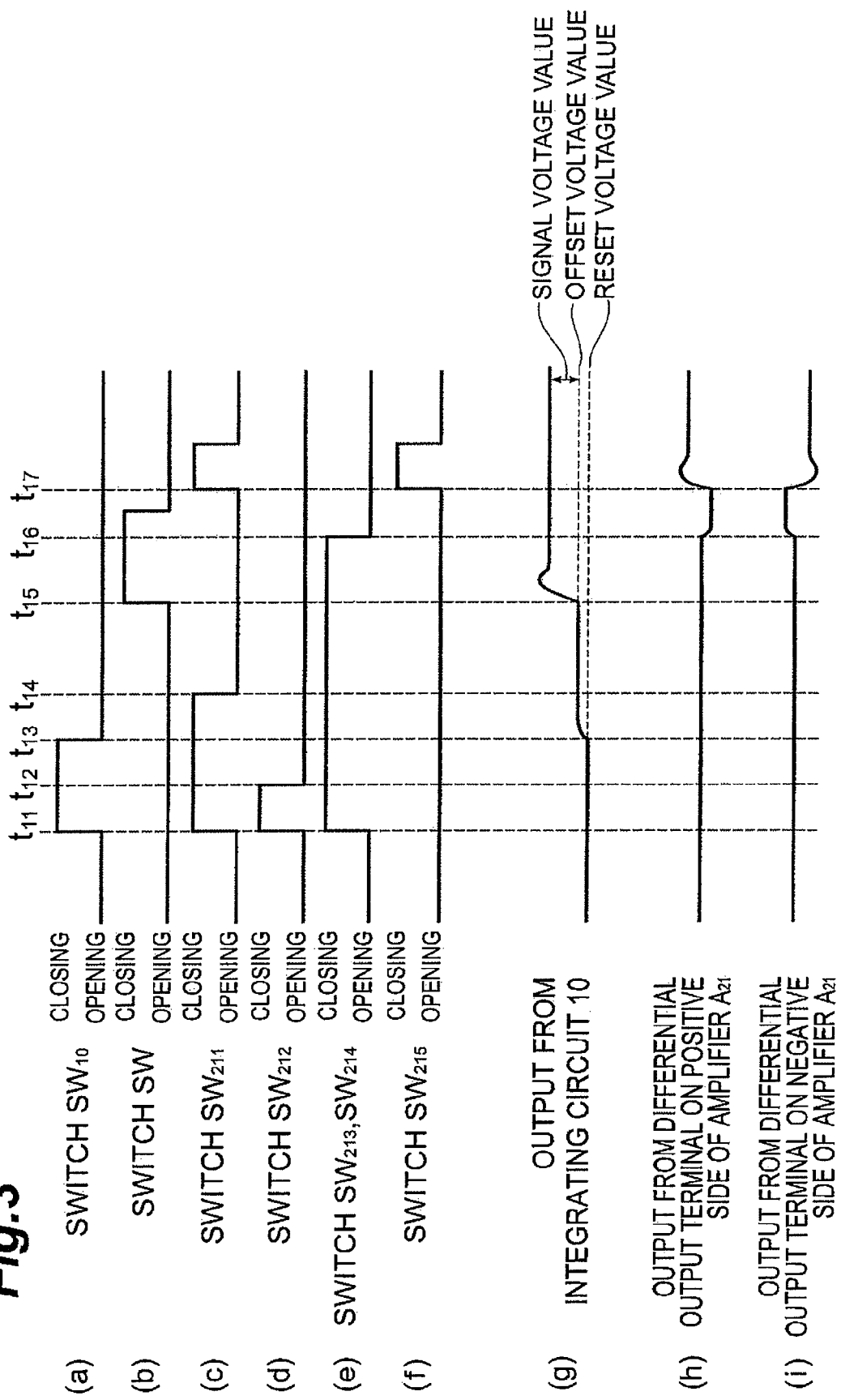
FIG. 3 is a timing chart for explaining operations of the photodetecting apparatus 1 of the present embodiment.

Next, a description will be given for operations of the photodetecting apparatus 1 of the present embodiment The following operation is performed under the control of the controller 90. FIG. 3 is a timing chart for explaining operations of the photodetecting apparatus 1 of the present embodiment. By referring to this drawing, a description will be given for the respective operations of the photodiode PD, the switch SW, the integrating circuit 10 and the differential amplifying portion 21.

This drawing shows the following: (a) opening and closing of the switch $SW_{10}$ included in the integrating circuit 10, (b) opening and closing of the switch SW installed so as to correspond to the photodiode PD, (c) opening and closing of the switch $SW_{211}$ included at the differential amplifying portion 21, (d) opening and closing of the switch $SW_{212}$ included at the differential amplifying portion 21, (e) opening and closing of the switch $SW_{213}$ and the switch $SW_{214}$ included at the differential amplifying portion 21, (f) opening and closing of the switch $SW_{215}$ included at the differential amplifying portion 21, (g) output voltage value from the integrating circuit 10, (h) output voltage value from a differential output terminal on the positive side of the amplifier $A_{21}$ included at the differential amplifying portion 21, and (i) output voltage value from a differential output terminal on the negative side of the amplifier $A_{21}$ included at the differential amplifying portion 21. In addition a difference in each time given in the drawing will be "$t_{11} < t_{12} < t_{13} < t_{14} < t_{15} < t_{16} < t_{17}$."

At the time $t_{11}$, the switch $SW_{10}$ included in the integrating circuit 10 is closed to discharge the capacitor $C_{10}$, thereby an output voltage value from the integrating circuit 10 is initialized. At the time $t_{11}$, the switch $SW_{213}$ and the switch $SW_{214}$ included at the differential amplifying portion 21 are closed to discharge the capacitor $C_{213}$ and capacitor $C_{214}$, thereby an output voltage value from the differential amplifying portion 21 is initialized. At the time $t_{12}$, the switch $SW_{212}$ included at the differential amplifying portion 21 is opened, at the time $t_{13}$, the switch $SW_{10}$ included in the integrating circuit 10 is opened, and at the time $t_{14}$, the switch $SW_{211}$ included at the differential amplifying portion 21 is opened. Thereafter, for a certain period of time from the time $t_{15}$, the switch SW is kept closed, and an electrical charge generated at the photodiode PD and accumulated in a junction capacitance portion of the photodiode PD is input into the integrating circuit 10 via the switch SW. At the time $t_{16}$, the switch $SW_{213}$ and the switch $SW_{214}$ included at the differential amplifying portion 21 are opened. At the time $t_{17}$, the switch $SW_{211}$ and the switch $SW_{215}$ included at the differential amplifying portion 21 are closed. In addition, over the above-described period, the respective switches $SW_{25}$ of the first feedback portion 25A and the second feedback portion 25B are opened.

A time when the integrating circuit 10 is able to accumulate an electrical charge is the time $t_{13}$ when the switch $SW_{10}$ is opened. For a period of the time $t_{13}$ to the time $t_{15}$, the integrating circuit 10 is in a state of accumulating the electrical charge because the switch $SW_{10}$ is opened. However, since the switch SW is opened, there is no chance that the electrical charge is input from the photodiode PD or no electrical charge is accumulated in the capacitor $C_{10}$. However, due to an offset error and the like, an output voltage value from the integrating circuit 10 undergoes a monotonous change after the time $t_{13}$ and then reaches an approximately constant voltage value (that is, an offset voltage value) at a certain time before the time $t_{14}$.

At the differential amplifying portion 21, the switch $SW_{212}$ is changed from a closed state to an opened state at the time $t_{12}$. Thereby, an amount of electrical charge corresponding to a voltage value output from the integrating circuit 10 at the time $t_{12}$ is accumulated in the capacitor $C_{212}$. Since the integrating circuit 10 is in a state of being initialized at the time $t_{12}$, an electrical charge accumulated in the capacitor $C_{212}$ is an amount corresponding to an output voltage value of the thus initialized integrating circuit 10 (hereinafter, referred to as "reset voltage value"). As described above, the reset voltage value is loaded into the differential amplifying portion 21.

At the differential amplifying portion 21, when the switch $SW_{211}$ is changed from a closed state to an opened state at the time $t_{14}$, an amount of electrical charge corresponding to a voltage value output from the integrating circuit 10 at the time $t_{14}$ is accumulated in the capacitor $C_{211}$. Since the integrating circuit 10 outputs an offset voltage value at the time $t_{14}$, an amount of electrical charge accumulated in the capacitor $C_{211}$ is an amount corresponding to an offset voltage value. As described above, the offset voltage value is loaded into the differential amplifying portion 21.

For a certain period of time from the time $t_{15}$, the switch SW is closed and an electrical charge generated at the photodiode PD and accumulated in a junction capacitance portion of the photodiode PD is input into the integrating circuit 10 via the switch SW. The electrical charge input into the integrating circuit 10 is accumulated in the capacitor $C_{10}$. A signal voltage value corresponding to an amount of the electrical charge accumulated in the capacitor $C_{10}$ is superimposed on the offset voltage value to obtain a voltage value, and this voltage value is output from the integrating circuit 10.

At the differential amplifying portion 21, when the switch $SW_{213}$ is opened at the time $t_{16}$ and the switch $SW_{211}$ is closed at the time $t_{17}$, a voltage value output from the integrating circuit 10 at the time $t_{17}$ is input into the capacitor $C_{211}$. Next, a difference between an amount of electrical charge corresponding to the voltage value and an amount of electrical charge which has already been accumulated in the capacitor $C_{211}$ is accumulated in the capacitor $C_{213}$. Then, a voltage value corresponding to the amount of electrical charge accumulated in the capacitor $C_{213}$ is input into the non-inverting input terminal of the amplifier $A_{21}$. This voltage value will be a difference between a voltage value obtained by superimposing a signal voltage value on an offset voltage value and the offset voltage value, that is, the signal voltage value. As described above, the differential amplifying portion 21 is also able to act as a CDS (Correlated Double Sampling) circuit.

At the differential amplifying portion 21, when the switch $SW_{214}$ is opened at the time $t_{16}$ and the switch $SW_{215}$ is closed at the time $t_{17}$, a voltage value of the electric source $E_{21}$ is input into the capacitor $C_{212}$. Then a difference between an amount of electrical charge corresponding to the voltage value of the electric source $E_{21}$ and an amount of electrical charge which has already been accumulated in the capacitor $C_{212}$ is accumulated in the capacitor $C_{214}$. A voltage value corresponding to the amount of electrical charge accumulated in the capacitor $C_{214}$ is input into an inverting input terminal of the amplifier $A_{21}$. The voltage value will be a difference between the voltage value of the electric source $E_{21}$ and the reset voltage value.

At the differential amplifying portion 21, after the time $t_{17}$, a signal of a voltage value corresponding to a difference between an input voltage value of the non-inverting input terminal of the amplifier $A_{21}$ and an input voltage value of the inverting input terminal thereof is output from the differential output terminal on the negative side of the amplifier $A_{21}$ and the differential output terminal on the positive side thereof. A center voltage value is set at the amplifier $A_{21}$, and the voltage value output from the differential output terminal on the positive side and that from the differential output terminal on the negative side can be expressed by the following formulae (1) and (2). In this instance, an output voltage value from the differential output terminal on the positive side is denoted by $V_{o+}$, an output voltage value from the differential output terminal on the negative side, $V_{o-}$; an input voltage value of the non-inverting input terminal, $V_{i+}$; an input voltage value of the inverting input terminal, $V_{i-}$; a center voltage value of the amplifier $A_{21}$, $V_{com}$.

$$V_{o+} = +(V_{i+} - V_{i-})/2 - (VE_{21} - Vr)/2 + V_{com} \quad (1)$$

$$V_{o-} = -(V_{i+} - V_{i-})/2 - (VE_{21} - Vr)/2 + V_{com} \quad (2)$$

The input voltage value $V_{i+}$ of the non-inverting input terminal is a signal voltage value. The input voltage value $V_{i-}$ of the inverting input terminal corresponds to a difference between a voltage value of the electric source $E_{21}$ and a reset voltage value. In this instance, $VE_{21}$ is a voltage value of the electric source $E_{21}$, and $Vr$ is a reset signal level voltage of the integrating circuit 10. The output voltage value $V_{o+}$ from the differential output terminal on the positive side and the output voltage value $V_{o-}$ from the differential output terminal on the negative side expressed by the above formulae (1) and (2) are eliminated for the offset error or the like and, therefore, excellent in S/N ratio. A voltage value output from the differential output terminal on the negative side of the differential amplifying portion 21 at a certain time after the time $t_{17}$ is output to the first variable capacitance portion 22A, and a voltage value output from the differential output terminal on the positive side of the differential amplifying portion 21 is output to the second variable capacitance portion 22B.

Then, a description will be given for the respective operations of the first variable capacitance portion 22A, the second variable capacitance portion 22B, the comparing portion 23 and the connection controlling portion 24. They are operated as a 6-bit successive approximation type AD converting circuit after the time $t_{17}$ and subsequently. Specifically, respectively at the first variable capacitance portion 22A and the second variable capacitance portion 22B, at a certain time after the time $t_{17}$, the switch $SW_{228}$ is closed, and common points $P_1$, $P_2$ are connected to a ground potential. Further, the capacitors $C_{221}$ to $C_{227}$ are connected to the output terminal of the differential amplifying portion 21 by the switches $SW_{221}$ to $SW_{227}$.

Thereafter, at the first variable capacitance portion 22A, when the switch $SW_{228}$ is opened, an amount of electrical charge corresponding to an output voltage value from the differential output terminal on the negative side of the differential amplifying portion 21 is accumulated on the side of the first common point $P_1$ of the capacitors $C_{221}$ to $C_{227}$. Further, at the second variable capacitance portion 22B, when the switch $SW_{228}$ is opened, an amount of electrical charge corresponding to an output voltage value from the differential output terminal on the positive side of the differential amplifying portion 21 is accumulated on the side of the second common point $P_2$ of the capacitors $C_{221}$ to $C_{227}$.

Then, respectively at the first variable capacitance portion 22A and the second variable capacitance portion 22B, the capacitors $C_{221}$ to $C_{227}$ are connected to the second reference potential $V_{ref2}$ by the switches $SW_{221}$ to $SW_{227}$. In this state, a potential difference between the first common point $P_1$ and, the second common point $P_2$ (that is, a difference between two voltage values input into the comparing portion 23) is a difference between the voltage values output respectively from the differential output terminal on the negative side of the differential amplifying portion 21 and the differential output terminal on the positive side thereof.

Thereafter, the potential of the first common point $P_1$ is compared with that of the second common point $P_2$ for the magnitude by the comparing portion 23, and a compared signal indicating the compared result is output to the connection controlling portion 24. The connection controlling portion 24 into which the compared signal is input controls on the basis of the compared signal the connection and switchover between the first reference potential $_{ref1}$ and the second reference potential$_{ref2}$ respectively by the switches $SW_{221}$ to $SW_{226}$ included respectively at the first variable capacitance portion 22A and the second variable capacitance portion 22B so as to decrease a difference between the respective potentials of the first common point $P_1$ and the second common point $P_2$. In this instance, a connection state of each of the corresponding switches will be decided in the order of capacitors greater in capacitance value, that is, in the order of the capacitor $C_{221}$ to $C_{226}$.

Then, after the connection state of each of the switches $SW_{221}$ to $SW_{226}$ is decided in such a manner that a difference between the respective potentials of the first common point $P_1$ and the second common point $P_2$ can be made minimal, a 6-bit digital value indicating the connection state of each of these switches is output from the connection controlling portion 24. Digital values output from the connection controlling portion 24 may be parallel data or serial data Among these 6-bit digital values, the highest bit data indicates a connection state of the switch $SW_{221}$, the second bit data, that of the switch $SW_{222}$; the third bit data, that of the switch $SW_{223}$; the fourth bit data, that of the switch $SW_{224}$; the fifth bit data, that of the switch $SW_{225}$; and the lowest bit data, that of the switch $SW_{226}$.

As described above, voltage values output as a differential signal respectively from the differential output terminal on the negative side of the differential amplifying portion 21 and the differential output terminal on the positive side thereof are subjected to A/D conversion to 6-bit digital values by the first variable capacitance portion 22A, the second variable capacitance portion 22B, the comparing portion 23, and the connection controlling portion 24. Then, these values are output from the connection controlling portion 24. In this instance, a difference in potential between the first common point $P_1$ and the second common point $P_2$ represents a difference between the voltage value and the input voltage value indicated by digital values after conversion. Therefore, this difference in potential is amplified $2^6$-fold, which is also subjected to the successive approximation-type A/D conversion similarly as described above, by which 6-bit digital values following the first 6 bit can be obtained.

Therefore, after determination of the first 6 bit, at the differential amplifying portion 21, the switches $SW_{213}$ and $SW_{214}$ are once closed to discharge the capacitors $C_{213}$ and $C_{214}$, and the respective output voltage values of the differential output terminal on the negative side and the differential output terminal on the positive side are initialized. Thereafter, the switches $SW_{213}$ and $SW_{214}$ are opened. Then, respectively at the first feedback portion 25A and the second feedback portion 25B, the switch $SW_{25}$ is opened after once being closed. Thereby, a difference in output voltage value between the inverting output terminal of the differential amplifying portion 21 and the non-inverting output terminal thereof is made $2^b$-fold greater than a difference in potential between the first common point $P_1$ and the second common point $P_2$. An output voltage value of the differential amplifying portion 21 is converted similarly as described above by the successive approximation type A/D converting circuit (made up of the first variable capacitance portion 22A, the second variable capacitance portion 22B, the comparing portion 23 and the connection controlling portion 24) to a 6-bit digital value.

As described above, in the A/D converting circuit 20, the voltage value output from the integrating circuit 10 is converted to a 12-bit digital value. Further, in general, feedback is performed by the first feedback portion 25A and the second feedback portion 25B at the number of times of (k−1), by which the successive approximation-type A/D conversion is performed at the number of times of k. Thereby, a voltage value output from the integrating circuit 10 is converted to a 6k-bit digital value.

Where one set of the integrating circuit 10 and the A/D converting circuit 20 is installed with respect to plural sets of photodiodes PD and switches SW, the above-described operation is performed sequentially to each of plural photodiodes PD. Further, where plural sets of photodiodes PD and switches SW are arrayed two-dimensionally and one set of the integrating circuit 10 and the A/D converting circuit 20 is installed for each row of the plural sets, the above operation is given to all the photodiodes PD placed on a certain row for a certain period of time, and the above operation is given to all the photodiodes PD placed on a next row for a subsequent period of time. Then, the photodetecting apparatus 1 in this instance acts as a two-dimensional imaging device and is able to pick up a two-dimensional image excellent in S/N ratio from which offset errors and the like are eliminated.

As so far described, the present embodiment is able to reduce the number of capacitors included respectively at the first variable capacitance portion 22A and the second variable capacitance portion 22B with respect to the number of bits of a digital value to be output. Therefore, the first variable capacitance portion 22A and the second variable capacitance portion 22B can be downsized respectively. As a result, the A/D converting circuit 20 and the photodetecting apparatus 1 can also be downsized. Where they are integrated, it is possible to reduce the chip area Further, the number of capacitors included respectively at the first variable capacitance portion 22A and the second variable capacitance portion 22B can be reduced, by which a capacitance value of each of the capacitors can be improved in accuracy and the A/D conversion can be performed at high accuracy. Still further, in the present embodiment, the differential amplifying portion 21 is free of resistors around the amplifier $A_{21}$, thus making it possible to suppress thermal noises at the differential amplifying portion 21 and also suppress the electric power consumption.

Further, in the present embodiment, the differential amplifying portion 21 is provided with the switch $SW_{215}$ and the electric source $E_{21}$, by which it is possible to expand an output range of the differential amplifying portion 21. FIG. 4 is a timing chart for explaining the operation of the differential amplifying portion 21 included in the AD converting circuit 20 of the present embodiment. This drawing shows (a) output voltage values from the differential output terminal on the positive end of the amplifier $A_{21}$ at the differential amplifying portion 21 used in the present embodiment which includes the switch $SW_{215}$ and the electric source $E_{21}$ and also (b) output voltage values from the differential output terminal on the positive side of the amplifier $A_{21}$ at the differential amplifying portion used in a comparative example which does not include the switch $SW_{215}$ and the electric source $B_{21}$.

Where an output voltage value of the electric source $E_{21}$ is given as 3.5V; a center voltage value $V_{com}$ of the amplifier $A_{21}$, 2.5V; and an input voltage value $V_{i+}$ of the non-inverting input terminal of the amplifier $A_{21}$, 0.2V to 3.2V (however, a relative value with respect to a reset level), as shown in FIG. 4 (a), an output voltage value $V_{o+}$ from the non-inverting output terminal is 1.6V to 3.1V. This value can be calculated from the previously described formula (1). Further, according to the formula (1), where an input voltage value $V_{i+}$ of the non-inverting input terminal is 0V, an output voltage value $V_{o+}$ from the differential output terminal on the positive side is 1.5V In other words, it is possible to output a voltage of 1.5V or more at the differential output terminal on the positive side of the amplifier $A_{21}$. In addition, an output range of the differential output terminal on the negative side of the amplifier $A_{21}$ can also be calculated by referring to the above formula (2). It is possible to output a voltage of 3.1V or less at the differential output terminal on the negative side.

On the other hand, at the differential amplifying portion used in the comparative example which does not include the switch $SW_{215}$ and the electric source $E_{21}$, a reset voltage value is to be input into the inverting input terminal of the amplifier $A_{21}$. Since the reset voltage value is substantially 0V, output voltage values from the differential output terminal on the positive side and the differential output terminal on the negative side can be expressed by the formulae (3) and (4) given below. In this instance, as with the previously-described formulae (1) and (2), an output voltage value from the differential output terminal on the positive side is given as $V_{o+}$; an output voltage value from the differential output terminal on the negative side, $V_{o-}$; an input voltage value of the non-inverting input terminal, $V_{i+}$; an input voltage value of the inverting input terminal, $V_{i-}$; and a center voltage value of the amplifier $A_{21}$, $V_{com}$.

$$V_{o+} = +V_{i+}/2 + V_{com} \quad (3)$$

$$V_{o-} = -V_{i+}/2 + V_{com} \quad (4)$$

In the above formula (3), where a center voltage value $V_{com}$ of the amplifier $A_{21}$ is given as 2.5V; an input voltage value $V_{i+}$ of the non-inverting input terminal of the amplifier $A_{21}$, 0.2V to 3.2V; (however, a relative value with respect to a reset level), as shown in FIG. 4 (b), an output voltage value $V_{o+}$ from the differential output terminal on the positive side is 2.6V to 4.1V Further, according to the formula (3), where an input voltage value $V_{i+}$ of the non-inverting input terminal is 0V, an output voltage value $V_{o+}$ from the differential output terminal on the positive side is 2.5V. In other words, it is impossible to output a voltage of less than 2.5V at the differential output terminal on the positive side of the amplifier $A_{21}$. In addition, an output range of the differential output terminal on the negative side of the amplifier $A_{21}$ can be calculated by referring to the above formula (4). It is impossible to output a voltage exceeding 2.5V at the differential output terminal on the negative side.

As apparent by the comparison with the operation of the differential amplifying portion shown in the comparative example which does not include the switch $SW_{215}$ and the electric source $E_{21}$, in the present embodiment having the differential amplifying portion 21 which includes the switch SW$_{215}$ and the electric source E$_{21}$, there are expanded an output range of the differential output terminal on the positive side of the amplifier A$_{21}$ included at the differential amplifying portion 21 and that of the differential output terminal on the negative side thereof In addition, in the photodetecting apparatus 1 and the A/D converting circuit 20 of the present embodiment, the differential amplifying portion 21 may be used so as not to act as a CDS circuit.

FIG. 5 is a timing chart for explaining the operation of the photodetecting apparatus 1 of the present embodiment, where the differential amplifying portion 21 is not allowed to act as the CDS circuit. The times t$_{11}$ to t$_{13}$, t$_{15}$ to t$_{17}$ shown in this drawing are the same as the times t$_{11}$ to t$_{13}$, t$_{15}$ to t$_{17}$ shown in FIG. 3. FIG. 5 (a) to (f) are substantially the same as FIG. 3 (a) to (f), but different from FIG. 3 in that the switch SW$_{211}$ shown in FIG. 5 (c) is opened at the time t$_{12}$.

When the switch SW$_{211}$ is opened at the time t$_{12}$, an amount of electrical charge corresponding to a reset voltage value is accumulated in the capacitor C$_{212}$. When the switch SW$_{213}$ is opened at the time t$_{16}$ and the switch SW$_{211}$ is closed at the time t$_{17}$, a difference between a signal voltage value on which an offset voltage value is superimposed and the reset voltage value is input into the non-inverting input terminal of the amplifier A$_{21}$. In this instance, as shown in FIGS. 5 (h) and (i), the differential output terminal on the negative side of the amplifier A$_{21}$ and the differential output terminal on the positive side thereof are to output a differential signal corresponding to the signal voltage value on which the offset voltage value is superimposed. As described so far, the switch SW$_{211}$ is closed at different timings, by which the differential amplifying portion 21 is allowed not to act as a CDS circuit. Thereby, the photodetecting apparatus 1 and the AD converting circuit 20 of the present embodiment are applicable to a case where there is no need for eliminating the offset voltage value.

INDUSTRIAL APPLICABILITY

The present invention is applicable to a photodetecting apparatus capable of outputting a digital value corresponding to an amount of incident light and also to an A/D converting circuit preferably used in the photodetecting apparatus.

The invention claimed is:

1. An A/D converting circuit in which N is an integer number equal to or greater than two, and n is an integer number equal to or greater than one but equal to or less than N, the A/D converting circuit comprising:

a differential amplifying portion including an amplifier having a first and a second input terminal as well as a first and a second output terminal, a first to a fourth capacitor, and a first to a fourth switch wherein one end of the first switch is connected to the first input terminal of the amplifier via the first capacitor, one end of the second switch is connected to the second input terminal of the amplifier via the second capacitor, the third switch and the third capacitor are installed in parallel between the first input terminal of the amplifier and the first output terminal thereof, and the fourth switch and the fourth capacitor are installed in parallel between the second input terminal of the amplifier and the second output terminal thereof, a first variable capacitance portion including N-number of capacitors with mutually different capacitance values (C, . . . , $2^{n-1}$C, . . . , $2^{N-1}$C) wherein one end of each of the N-number of capacitors is connected to the first output terminal of the amplifier via first connection switchover means, a first reference potential or a second reference potential, and the other end of each of the N-number of capacitors is connected to a first common point, a second variable capacitance portion including N-number of capacitors with mutually different capacitance values (C, . . . , $2^{n-1}$C, . . . , $2^{N-1}$C) wherein one end of each of the N-number of capacitors is connected to the second output terminal of the amplifier, the first reference potential or the second reference potential via second connection switchover means, and the other end of each of the N-number of capacitors is connected to a second common point, a comparing portion for inputting the respective potentials of the first and the second common point for comparison of the magnitude and outputting a compared signal which indicates the compared result, a connection controlling portion which inputs the compared signal output from the comparing portion, controls the connection and switchover respectively by the first and the second connection switchover means on the basis of the compared signal so as to decrease a difference between the respective potentials of the first and the second common point and outputs an N-bit digital value indicating the respective connection states by the first and the second connection switchover means, a first feedback portion including a first feedback capacitor and a first feedback switch wherein one end of the first feedback capacitor is connected to the first common point via the first feedback switch and the other end of the first feedback capacitor is connected to the first input terminal of the amplifier, and a second feedback portion including a second feedback capacitor and a second feedback switch wherein one end of the second feedback capacitor is connected to the second common point via the second feedback switch and the other end of the second feedback capacitor is connected to the second input terminal of the amplifier.

2. The A/D converting circuit according to claim 1, wherein the differential amplifying portion further includes a fifth switch and an electric source and the electric source is connected to a connection point between the second switch and the second capacitor via the fifth switch.

3. A photodetecting apparatus comprising:

a photodiode which generates an amount of electrical charge corresponding to an amount of incident light;

an integrating circuit which inputs an electrical charge generated in the photodiode and accumulates it to output a voltage value corresponding to an amount of the thus accumulated electrical charge from an output end; and the A/D converting circuit according to claim 1 or claim 2, wherein the first and the second switch of the differential amplifying portion included in the A/D converting circuit are connected to the output end of the integrating circuit.

* * * * *